United States Patent
Kim

(10) Patent No.: US 7,257,096 B2
(45) Date of Patent: Aug. 14, 2007

(54) GLOBAL SYSTEM FOR MOBILE COMMUNICATION (GSM) AND GENERAL PACKET RADIO SERVICE (GPRS) POWER RAMPING CONTROLLER AND ASSOCIATED POWER RAMPING METHOD

(75) Inventor: Dong-han Kim, Seoul (KR)

(73) Assignee: Samsung Electronics Co., Ltd., Suwon-Si (KR)

( * ) Notice: Subject to any disclaimer, the term of this patent is extended or adjusted under 35 U.S.C. 154(b) by 589 days.

(21) Appl. No.: 10/886,925

(22) Filed: Jul. 8, 2004

(65) Prior Publication Data

US 2005/0018780 A1    Jan. 27, 2005

(30) Foreign Application Priority Data

Jul. 11, 2003    (KR) ...................... 10-2003-0047418

(51) Int. Cl.
*H04B 7/185* (2006.01)

(52) U.S. Cl. ...................... 370/318; 370/508; 455/522; 455/69

(58) Field of Classification Search ................ 370/318, 370/321, 508; 455/522, 232.1, 234.2, 69
See application file for complete search history.

(56) References Cited

U.S. PATENT DOCUMENTS

| | | | | |
|---|---|---|---|---|
| 5,150,075 | A | | 9/1992 | Hietala et al. ............... 330/279 |
| 5,663,954 | A | * | 9/1997 | Hakkanen et al. .......... 370/278 |
| 5,675,611 | A | * | 10/1997 | Lehtinen et al. ............. 375/297 |
| 5,809,017 | A | | 9/1998 | Smith et al. ................. 370/318 |
| 6,097,251 | A | * | 8/2000 | Khullar et al. .............. 330/129 |
| 6,868,279 | B2 | * | 3/2005 | Sahlman et al. ............. 455/522 |
| 2006/0154626 | A1 | * | 7/2006 | Maerzinger et al. ..... 455/127.1 |
| 2007/0079055 | A1 | * | 4/2007 | Chandramouli et al. .... 711/103 |

* cited by examiner

*Primary Examiner*—CongVan Tran
(74) *Attorney, Agent, or Firm*—F. Chau & Associates, LLC

(57) ABSTRACT

A (GSM) and (GPRS) power ramping controller and an associated power ramping method are provided. Each frame to be transmitted has a plurality of slots, and each slot has a data period and a guard period for classifying continuous slots of the plurality of slots, and the guard period has a U-shaped power level waveform. The power ramping controller includes a ramp memory for dividing power levels of the of the plurality of slots within a power level range and storing the divided power level range from a lowermost address to an uppermost address; a counter for allocating a start address of the ramp memory for designating a power level of a first slot of the plurality of slots to a lower index and a final address of the ramp memory for designating a power level of a second slot of the plurality of slots to an upper index; and a controller for dividing the guard period into a number of indices of the counter, increasing the lower index of the counter by 1 and subtracting 1 from the start address, decreasing the upper index of the counter by 1 and subtracting 1 from the final address, designating an address, at a time when a difference obtained by subtracting the start address from the final address is 0 or 1, as an inflection address, and determining ramp steps as power levels stored in addresses corresponding to the number of indices of the counter at the guard period.

18 Claims, 8 Drawing Sheets

FIG. 6

| COUNTER(INDEX) | 1 | 2 | 3 | 4 | 5 | 6 | 7 | 8 | 9 | 10 | 11 | 12 | 13 | 14 | 15 | 16 |
|---|---|---|---|---|---|---|---|---|---|---|---|---|---|---|---|---|
| START ADDRESS | (7) | 6 | 5 | 4 | 3 | (2) | 1 | | | | | | | | | |
| FINAL ADDRESS | | | | | 1 | (2) | 3 | 4 | 5 | 6 | 7 | 8 | 9 | 10 | 11 | (12) |
| START ADDRESS | (12) | 11 | 10 | 9 | 8 | 7 | 6 | 5 | 4 | (3) | 2 | 1 | | | | |
| FINAL ADDRESS | | | | | | | | | 1 | (2) | 3 | 4 | 5 | 6 | 7 | (8) |

FIRST EXAMPLE (rows 1–2)
SECOND EXAMPLE (rows 3–4)

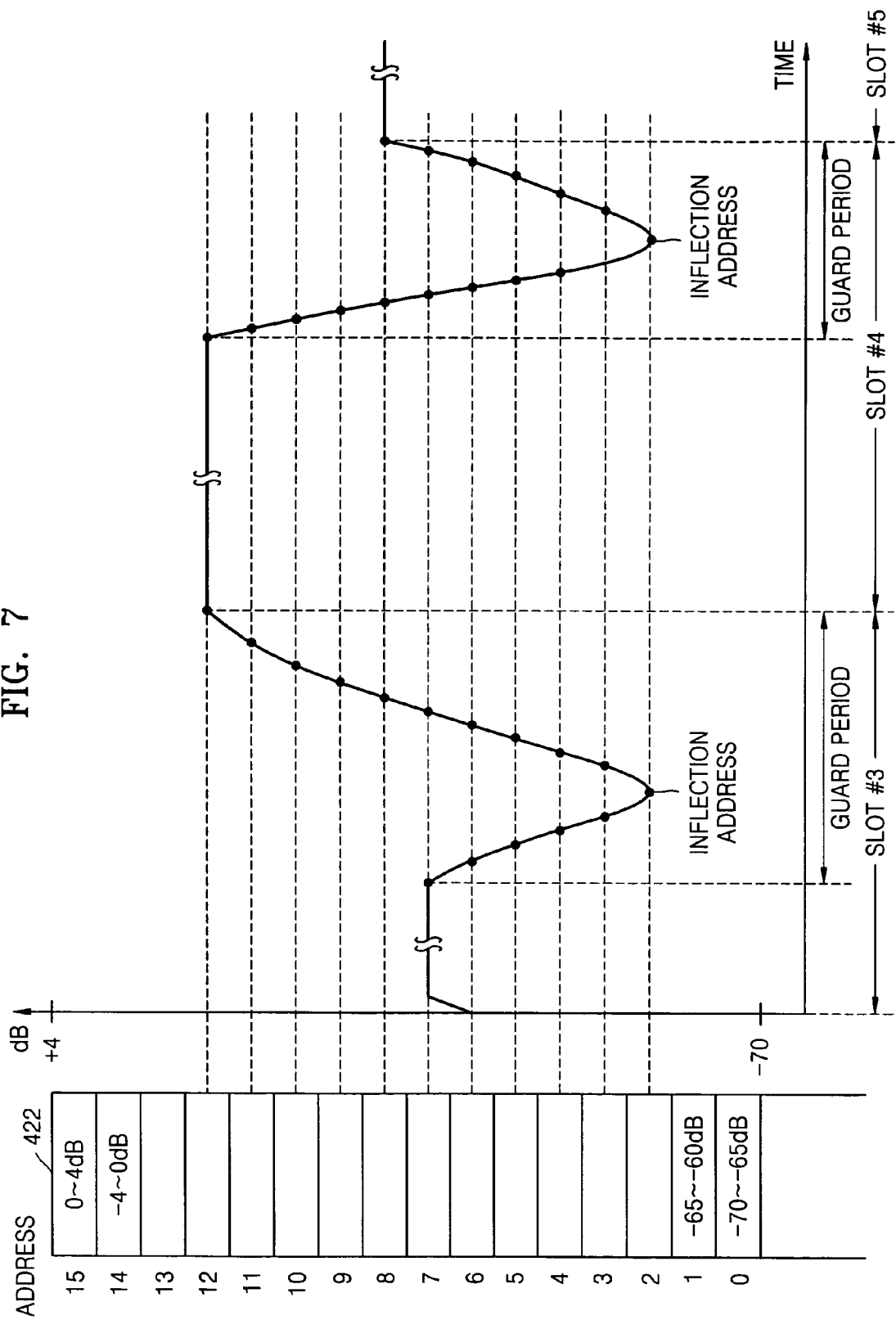

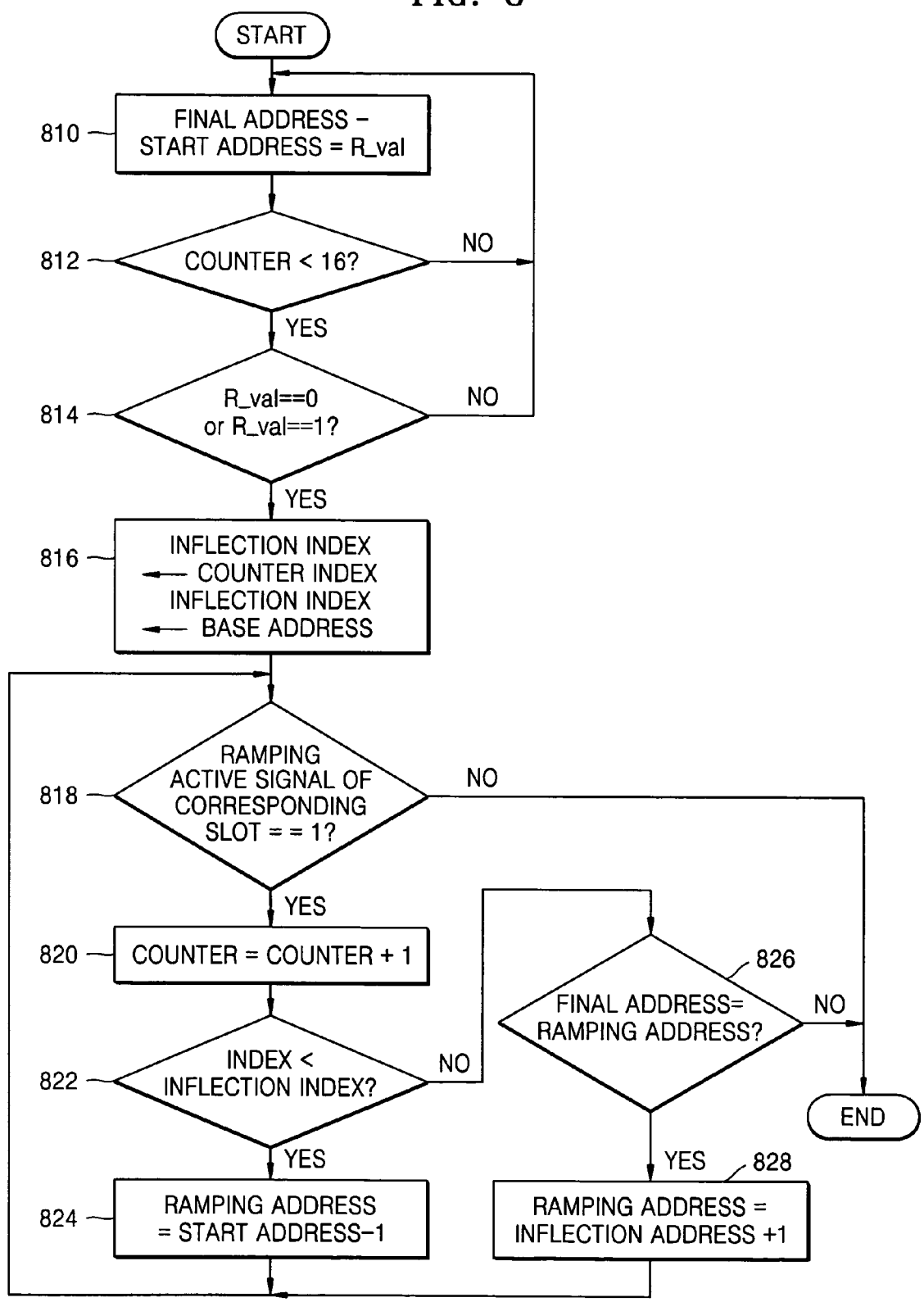

GLOBAL SYSTEM FOR MOBILE COMMUNICATION (GSM) AND GENERAL PACKET RADIO SERVICE (GPRS) POWER RAMPING CONTROLLER AND ASSOCIATED POWER RAMPING METHOD

CROSS-REFERENCE TO RELATED APPLICATION

This application claims priority to Korean Patent Application No. 2003-47418, filed on Jul. 11, 2003, in the Korean Intellectual Property Office, the disclosure of which is incorporated herein in its entirety by reference.

BACKGROUND OF THE INVENTION

1. Technical Field

The present invention relates to a radio frequency (RF) transmitter, and more particularly, to a global system for mobile communication (GSM) and general packet radio service (GPRS) power ramping controller, and an associated power ramping method.

2. Discussion of the Related Art

Due to the rapid increase in demand for mobile communication services, mobile communication systems are being developed at a surprisingly quick pace. Currently, the combination of mobile communication systems with the Internet is progressing at an amazing rate. In particular, the use of mobile packet data and Internet services through a wireless mobile communication network connection of a subscriber to an Internet service provider (ISP) is expected to increase. In order to meet these demands, environments for supporting packet data services, Internet services, and existing communication services on the Internet are growing rapidly.

The global system for mobile communication (GSM)-based European mobile communication network, which is widely used in about half of the worldwide mobile communication markets, has been combined with general packet radio service (GPRS), which is a wireless packet network, and has been developed to provide both a subscriber line and a packet mobile communication service to mobile subscribers.

GPRS is a wireless communication service that improves spectral efficiency and has certain advantages such as payment based on a data amount, a high data rate, and a short connection setting time using packet switched services. Because GPRS promises data rates from 56 up to 114 Kbps, and allows for continuous connection of mobile phones and computers to the Internet, GPRS complements GSM using existing circuit switched services.

Because GSM uses circuit switched services, a user's transmitted or received data is allocated to only one slot in each frame of a time division multiple access (TDMA) transmission scheme, where a frame is comprised of eight time slots. However, in GPRS using the packet switched services, a user's transmitted or received data uses multiple slots. For example, in GPRS, one to eight slots of a frame can be allocated to a single user. This allows users to effectively use frequency resources and to dynamically share frequency resources available on a base station between a GSM network and a GPRS network.

In current techniques using multiple slots, a maximum of five slots can be combined into one frame. In other words, transmission (Tx)/reception (Rx) combinations of (1×1), (2×1), (3×1), (4×1), (2×2), and (3×2), are possible. When using multiple slots, each slot is adjusted to different power levels in order to classify the slots in a frame.

GSM and GPRS perform power ramping-up and power ramping-down using a power amplifier. In order to control the power amplifier, a ramp memory controller and a ramp memory are disposed in a transmitter of a telephone to vary a power level. Ramp-up and ramp-down values are stored in the ramp memory. Here, ramp-up values mean an increase in power level, and ramp-down values means a reduction in power level. Ramp-up/-down time, which is stipulated as a standard, is within 28 μs, and the dynamic range for this short amount of time is 32 levels from −70 dB to 4 dB. The dynamic level is adjusted to compensate for the power level, which is attenuated according to the distance between the telephone and its base station.

Referring to FIG. 1, a prior art TDMA frame includes 8 slots (0, 1, 2, 3, 4, 5, 6, 7). The length of each slot is $15/26$ ms=576.9 μs, and the length of the TDMA frame is 8×576.9 μs=4615.4 μs=4.615 ms.

FIG. 2 is a prior art waveform in which each slot of, for example, the TDMA frame of FIG. 1 has a predetermined power level. A third slot (Slot #3) of the eight slots of the TDMA frame includes a valid data transmission period of 546.4 μs and a guard period of 30.5 μs, which when totaled together have a length of 576.9 μs. When a valid data period is a normal burst, burst data of 147 bits is transmitted. Power ramping is performed during the guard period to classify adjacent slots, and a power level is determined by the distance between a telephone and a base station.

In this way, GSM needs power ramping control with respect to each of the slots in the TDMA frame. With regard to GPRS using multiple slots, when transmission is selectively performed a maximum of four times with respect to the 8 slots of the TDMA frame, power ramping-up/-down should be performed a maximum of five times. Thus, five ramping values should be allocated to a ramping memory for the ramp-up/-down time. This reduces the processing speed in a telephone in which data transmission is realized in real-time and increases power consumption.

Accordingly, a new power ramping method and a controller thereof having a large power level difference are needed to reduce processing time and interference between slots in GPRS when using multiple slots.

SUMMARY OF THE INVENTION

According to one aspect of the present invention, there is provided a power ramping controller of a transmitter comprising frames for transmitting, each frame comprising a plurality of slots, each slot comprising a data period and a guard period for classifying continuous slots of the plurality of slots. The power ramping controller comprises a ramp memory for dividing power levels of the plurality of slots within a power level range and storing the divided power level range from a lowermost address to an uppermost address; a counter for allocating a start address of the ramp memory for designating a power level of a first slot of the plurality of slots to a lower index and a final address of the ramp memory for designating a power level of a second slot of the plurality of slots to an upper index; and a controller for dividing the guard period into a number of indices of the counter, increasing the lower index of the counter by 1 and subtracting 1 from the start address, decreasing the upper index of the counter by 1 and subtracting 1 from the final address, designating an address, at a time when a difference obtained by subtracting the start address from the final address is 0 or 1, as an inflection address, and determining ramp steps as power levels stored in addresses corresponding to the number of indices of the counter at the guard period.

The power ramping controller may be connected to a power amplifier for outputting the power levels of the plurality of slots in response to the ramp steps, and the power amplifier may have a U-shaped power ramping waveform in the guard period, wherein a power level of the start address lowers to a power level of the inflection address and then heightens to a power level of the final address. In addition, the transmitter may be a radio-frequency (RF) transmitter and the power levels of the plurality of slots are divided equally within the power level range.

According to another aspect of the present invention, there is provided a power ramping controller of a transmitter comprising frames for transmitting, each frame comprising a plurality of slots, each slot comprising a data period and a guard period for classifying continuous slots of the plurality of slots. The power ramping controller comprises a ramp memory for dividing power levels of the plurality of slots within a power level range and storing the divided power level range from a lowermost address to an uppermost address; a first register for storing a start address of the ramp memory for designating a power level of a first slot of the plurality of slots; a second register for storing a final address of the ramp memory for designating a power level of a second slot of the plurality of slots; a counter for allocating the start address to a lower index, allocating the final address to an upper index, increasing the lower index by 1 and subtracting 1 from the start address, and decreasing the upper index by 1 and subtracting 1 from the final address; a comparator for comparing an address obtained by subtracting 1 from the start address with an address obtained by subtracting 1 from the final address; a third register for storing a counter index and an address at a time when a difference obtained by subtracting the start address from the final address is 0 or 1; and a ramp controller for designating the address stored in the third register as an inflection address and determining ramp steps as power levels stored in addresses which correspond to a final address of the upper index from a start address of the lower index via the inflection address at the guard period.

The power ramping controller further comprises: a buffer for receiving data stored in addresses which correspond to a final address of the upper index from a start address of the lower index via the inflection address in response to a ramping active signal that represents a start time of the plurality of slots; a linear interpolation unit for interpolating a ramp level according to an output of the buffer; and a multiplexer (MUX) for selectively outputting ramp step signals according to one of the output of the buffer and an output of the linear interpolation unit in response to a control signal.

According to yet another aspect of the present invention, there is provided a method for ramping power in a transmitter comprising frames for transmitting, each frame comprising a plurality of slots, each slot comprising a data period and a guard period for classifying continuous slots of the plurality of slots. The method comprises dividing power levels of the plurality of slots within a power level range and storing the divided power level range from a lowermost address to an uppermost address; receiving a start address of a ramp memory for designating a power level of a first slot of the plurality of slots and a final address of the ramp memory for designating a power level of a second slot of the plurality of slots; allocating the start address to a lower index of a counter and increasing the lower index by 1 and subtracting 1 from the start address; allocating the final address to an upper index of the counter and decreasing the upper index by 1 and subtracting 1 from the final address; designating an address, at a time when a difference obtained by subtracting the start address from the final address is 0 or 1, as an inflection address, and determining ramp steps as power levels stored in addresses corresponding to the indices of the counter at the guard period; and outputting power levels of the plurality of slots in response to the ramp steps. The power levels of the plurality of slots within the power level range may be divided equally.

According to a further aspect of the present invention, there is provided a method for ramping power in a transmitter comprising frames for transmitting, each frame comprising a plurality of slots, each slot comprising a data period and a guard period for classifying continuous slots of the plurality of slots. The method comprises dividing power levels of the plurality of slots within a power level range and storing data that represents the divided power level range from a lowermost address to an uppermost address; receiving a start address of a ramp memory for designating a power level of a first slot of the plurality of slots; receiving a final address of the ramp memory for designating a power level of a second slot of the plurality of slots; allocating the start address to a lower index of a counter and increasing the lower index by 1 and subtracting 1 from the start address; allocating the final address to an upper index of the counter and decreasing the upper index by 1 and subtracting 1 from the final address; comparing an address obtained by subtracting 1 from the start address with an address obtained by subtracting 1 from the final address; storing a counter index and an inflection address at a time when a difference obtained by subtracting the start address from the final address is 0 or 1; receiving the data stored in addresses which correspond to a final address of the upper index from a start address of the lower index via the inflection address in response to a ramping active signal that represents a start time of the plurality of slots; and dividing the guard period into a number of indices of the counter and allocating a ramp waveform characteristic of the guard period according to the data stored in the addresses corresponding to the number of indices of the counter.

The method may further include linearly interpolating the data stored in the addresses corresponding to the number of indices of the counter and generating a power waveform of the guard period. The power levels of the plurality of slots within the power level range may also be divided equally.

According to a further aspect of the present invention, there is provided a method for ramping power in a transmitter comprising frames for transmitting, each frame comprising a plurality of slots, each slot comprising a data period and a guard period for classifying continuous slots of the plurality of slots. The method includes initializing a counter; dividing power levels of the plurality of slots within a power level range and storing data that represents the divided power level range from a lowermost address to an uppermost address; receiving a start address of a ramp memory for designating a power level of a first slot of the plurality of slots; receiving a final address of the ramp memory for designating a power level of a second slot of the plurality of slots; storing an inflection index and an inflection address at a time when a difference obtained by subtracting the start address from the final address is 0 or 1; increasing an index of the counter by 1 in response to a ramping active signal that represents a start time of the plurality of slots; subtracting 1 from the start address until the index of the counter becomes the inflection index and allocating the start address to a ramping address; wherein if the index of the counter is greater than the inflection index and the ramping address is not the final address, adding 1 to the inflection index; and allocating a ramp waveform characteristic of the guard period according to the data stored in ramping addresses. The power levels of the plurality of slots within the power level range may also be divided equally.

BRIEF DESCRIPTION OF THE DRAWINGS

The above objects of the present invention will become more apparent by describing in detail exemplary embodiments thereof with reference to the attached drawings, in which:

FIG. 6 is a diagram illustrating a function of the address controller of FIG. 5;

FIG. 7 illustrates a power level waveform to which the concept of FIG. 6 is applied; and FIG. 8 is a flowchart illustrating the power ramping method according to an exemplary embodiment of the present invention.

DETAILED DESCRIPTION OF EXEMPLARY EMBODIMENTS

Figure 1:
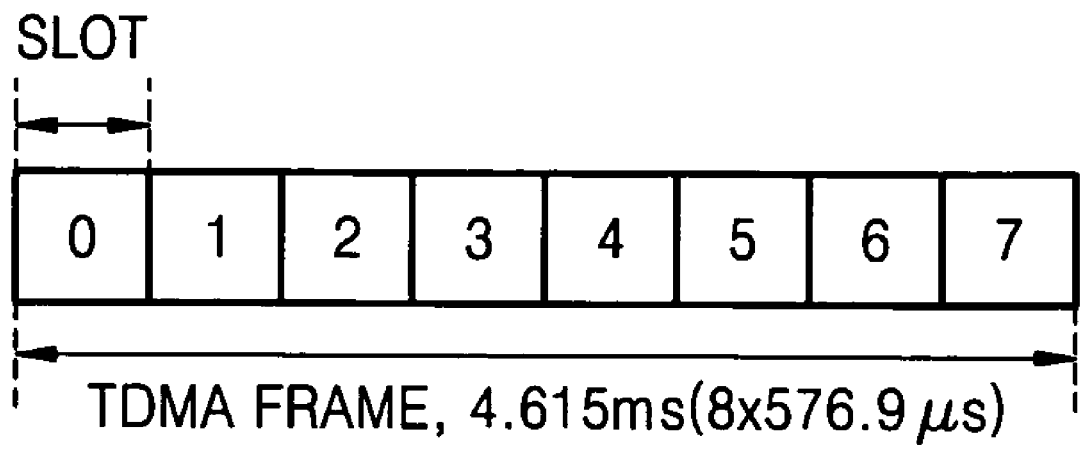
FIG. 1 illustrates a prior art time division multiple access (TDMA) frame including eight slots.
Figure 2:
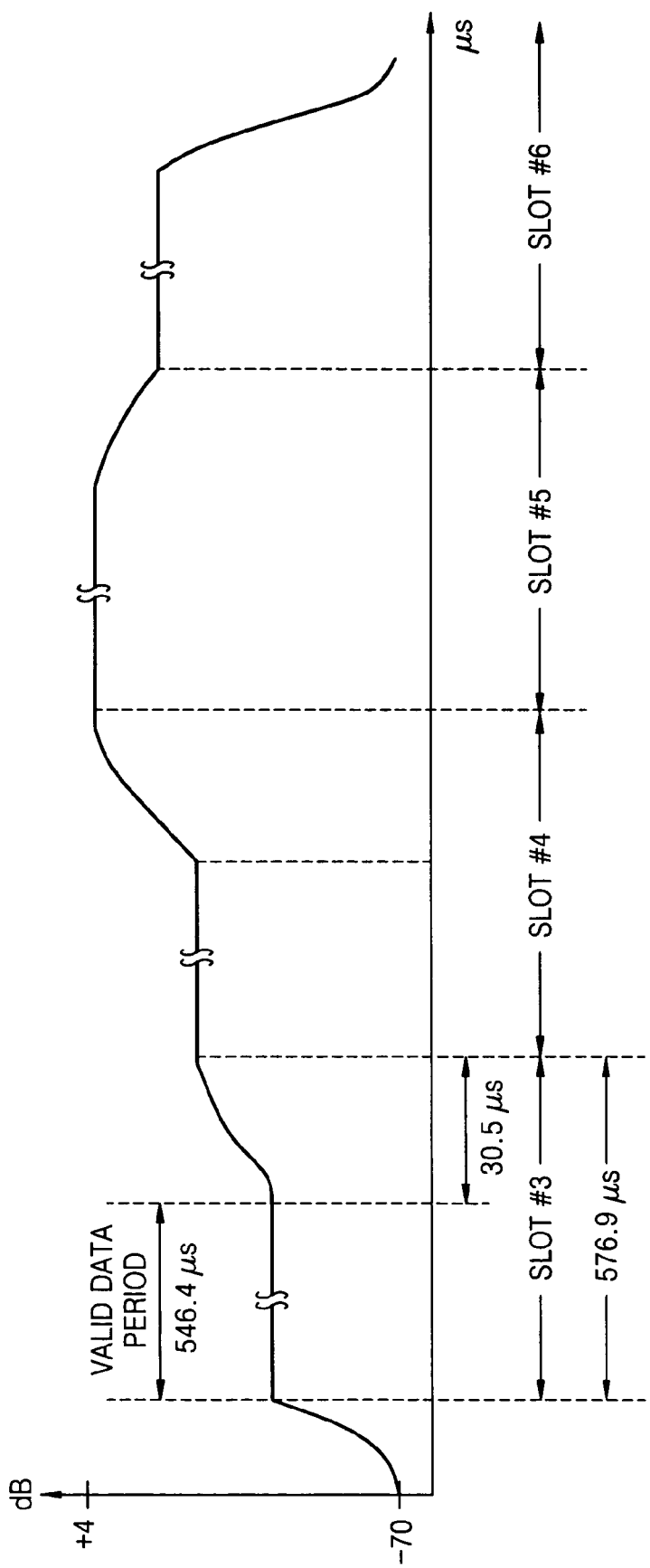
FIG. 2 is a prior art waveform in which each slot of the TDMA frame of FIG. 1 has a predetermined power level.
Figure 3:
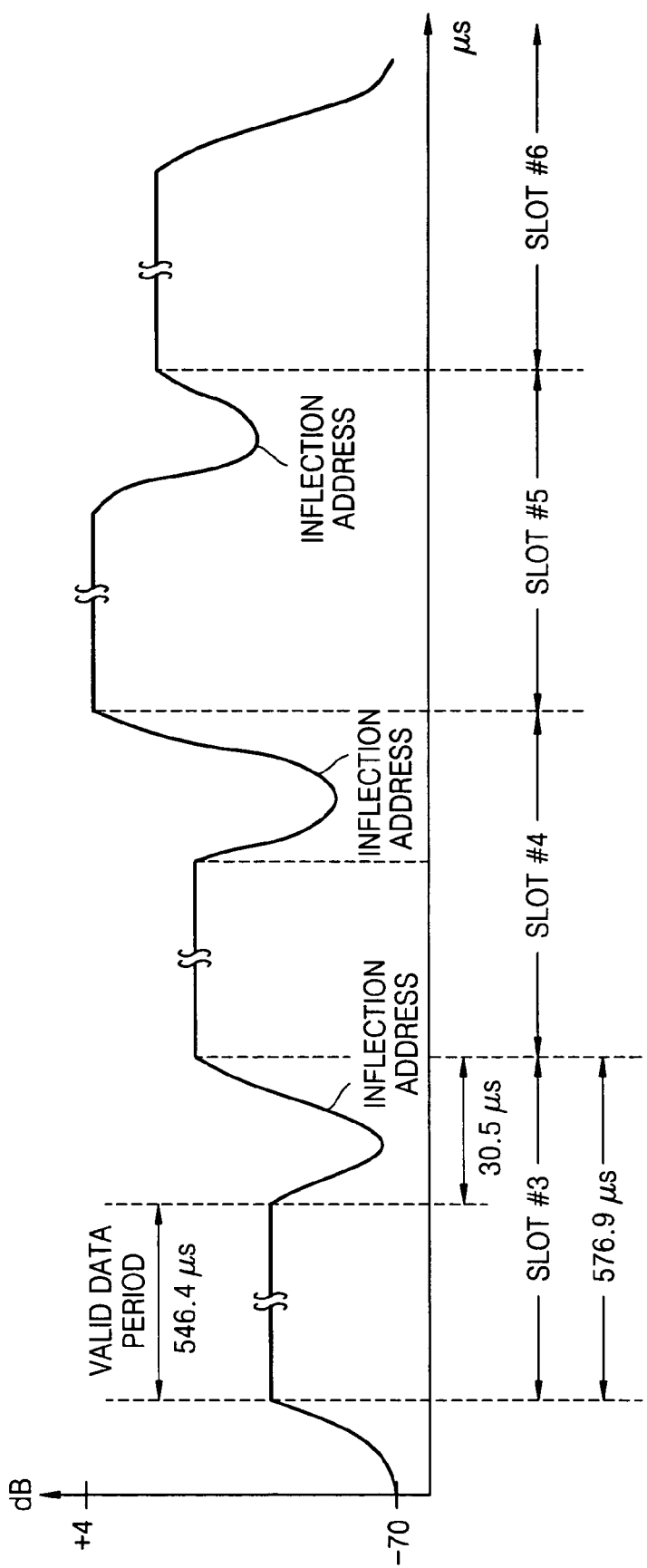
FIG. 3 illustrates slots having U-shaped power level waveforms formed using a power ramping method according to an exemplary embodiment of the present invention.

FIG. 3 illustrates slots having U-shaped power level waveforms formed using a power ramping method according to an exemplary embodiment of the present invention. As shown in FIG. 3, power ramping in guard periods (e.g., 30.5 μs) of slots Slot #3, Slot #4, Slot #5, and Slot #6 is identified by a gently curved U-shaped waveform. In the power ramping method of the present invention, an inflection address is obtained through upward ramping performed after downward ramping. In addition, there is a large power difference between the slots Slot#3, Slot#4, Slot#5, and Slot#6 so that interference between the slots Slot#3, Slot#4, Slot#5, and Slot#6 is reduced and thus information from the slots Slot#3, Slot#4, Slot#5, and Slot#6 is easily read. Further, overshoot is reduced and a ramping operation is performed to increase and/or decrease the power level of each of the slots Slot#3, Slot#4, Slot#5, and Slot#6.

Figure 4:
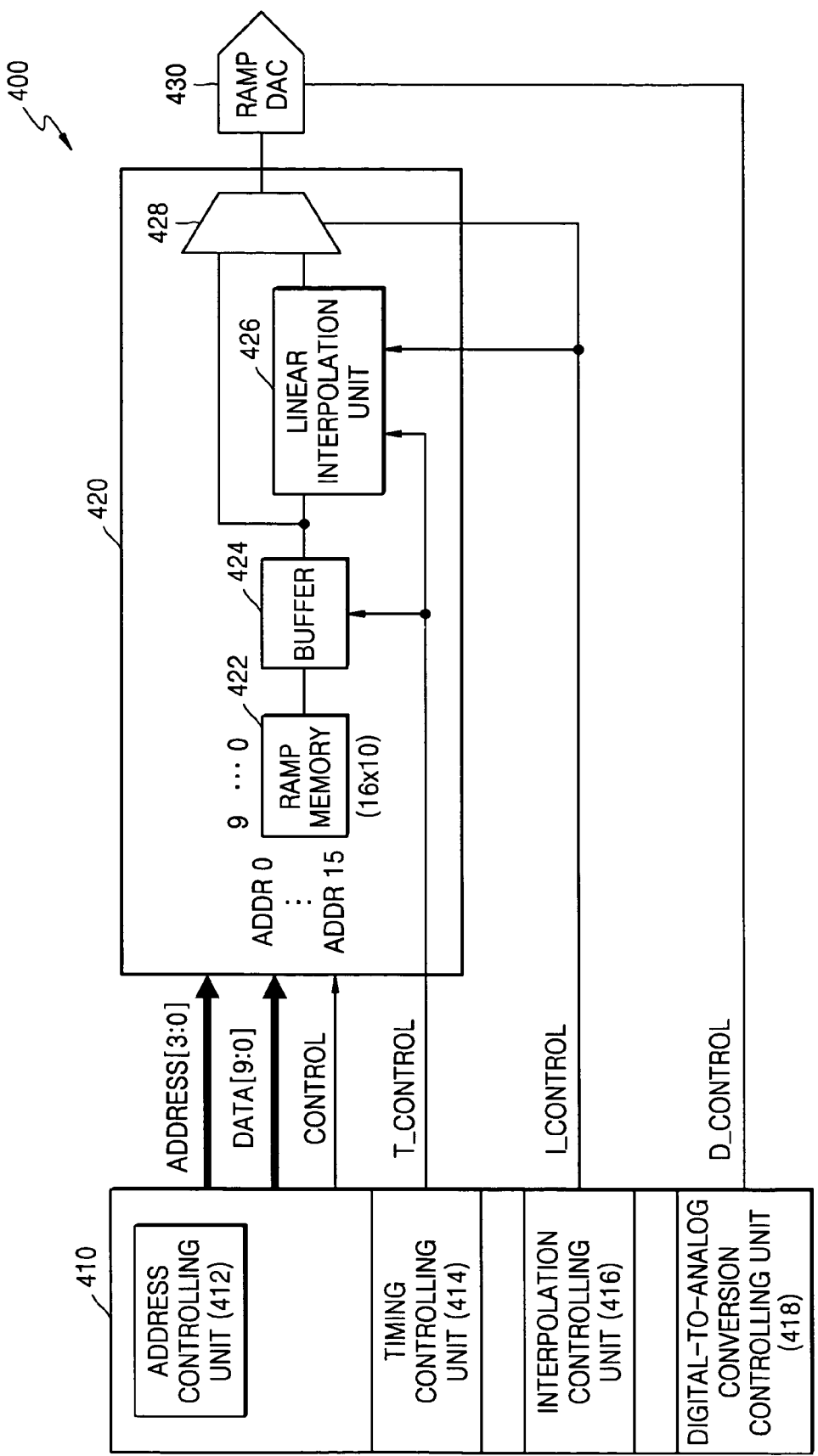
FIG. 4 illustrates a hardware structure for forming the U-shaped power level waveforms of FIG. 3.

Hardware for implementing the power ramping method of the present invention is shown in FIG. 4. FIG. 4 illustrates a ramp memory controller 400 of a telephone. The ramp memory controller 400 includes a controlling unit 410; a ramp memory block 420 comprising a ramp memory 422, a buffer 424, a linear interpolation unit 426; a multiplexer (MUX) 428; and a ramp digital-to-analog converter (DAC) 430. The controlling unit 410 includes an address controlling unit 412, a timing controlling unit 414, an interpolation controlling unit 416, and a digital-to-analog conversion controlling unit 418. The controlling unit 410 controls control signals for wireless data transmission and reception.

The control signals include a digital-to-analog conversion signal D_Control for switching on/off the ramp DAC 430, an address signal Address[3:0] for controlling the ramp memory block 420, a data signal Data[9:0], a memory block operation control signal Control, a timing control signal T_Control, and an interpolation control signal I_Control. The address signal Address[3:0] is also used for addressing the ramp memory 422 in the ramp memory block 420.

The ramp memory 422 consists of 16 memories each composed of 10 bits. The data signal Data[9:0], which represents a ramp level, is stored in 10 bits of the ramp memory 422. Ramp levels obtained by dividing the range from −70 dB to 4 dB at predetermined intervals, are stored in each address from a zero address Addr0 to a fifteenth address Addr15 of the ramp memory 422. For example, a ramp level which corresponds to −70 dB to −65 dB is stored in the zero address Addr0, a ramp level which corresponds to −65 dB to −60 dB is stored in a first address Addr1, and a ramp level which corresponds to 0 dB to +4 dB is stored in the fifteenth address Addr15.

The memory block operation control signal Control is used to control write and read operations of the ramp memory block 420. The timing control signal T_Control generated in the timing controlling unit 414, which represents a start time of slots, is used as a ramping active signal of corresponding slots, and controls an operating time of the buffer 424 and the linear interpolation unit 426.

The interpolation control signal I_Control generated in the interpolation controlling unit 416 is used to enable the linear interpolation unit 426, which interpolates a ramp level through a numerical calculation, and the MUX 428. The MUX 428 transmits an output of the buffer 424 or an output of the linear interpolation unit 426 to the ramp DAC 430, which recognizes the output of the linear interpolation unit 426 as a ramping address, in response to the interpolation control signal I_Control. The ramp DAC 430 controls a power amplifier so that a power waveform is generated during a guard period in response to data stored at ramping addresses.

Figure 5:
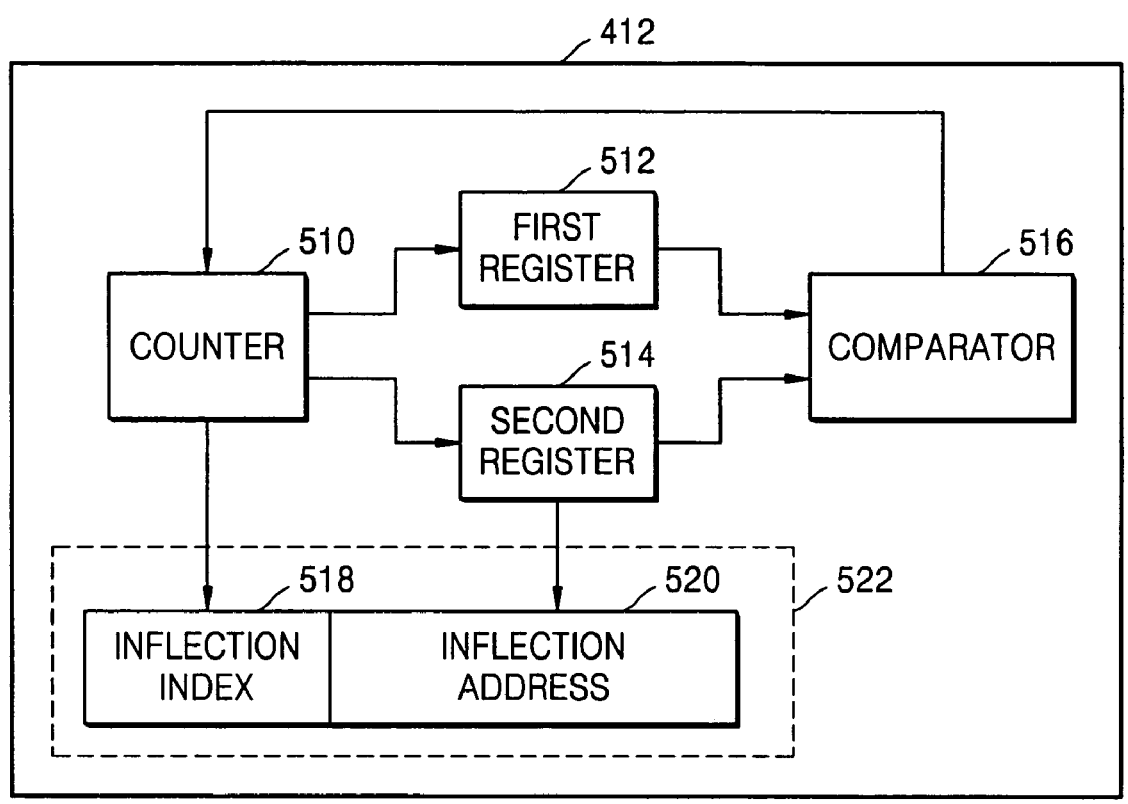
FIG. 5 illustrates an address controller of FIG. 4.

FIG. 5 illustrates the address controlling unit 412 of FIG. 4. Referring to FIG. 5, the address controlling unit 412 includes a counter 510, a first register 512, a second register 514, a comparator 516, and a third register 522. A start address is stored in the first register 512, and a final address is stored in the second register 514.

The start address is an address at which a power level of a currently used slot is stored, and the final address is an address in which a power level of a slot that is to be used next is stored. The counter 510 counts 16 steps, subtracts 1 from both the start address and the final address, and finds a time when the start address and the final address are the same or a base address in which the difference between the start address and the final address is 1. The comparator 516 compares the start address to the final address and transmits to the counter 510 a time when the difference between the start address and the final address is 0 or 1. In this case, a counter index is stored in an inflection index 518 of the third register 522, and a base address is stored in an inflection address 520 of the third register 522.

FIG. 6 is a diagram illustrating an operation of the address controlling unit 412 of FIG. 5. FIG. 6 illustrates a first example in which a start address is 7 and a final address is 12, and a second example in which the start address is 12 and the final address is 8.

In the first example, at the start address 7 allocated to a counter index 1, the counter index is increased by 1 and 1 is subtracted from the start address so that addresses are sequentially 6, 5, 4, 3, 2, 1, and 0. At the final address 12 allocated to a counter index 16, the counter index is decreased by 1 and 1 is subtracted from the final address so that addresses are sequentially 11, 10, 9, 8, 7, 6, 5, 4, 3, 2, 1, and 0. Then, 1 is respectively subtracted from the start address 7 and the final address 12 so that the start address and the final address are both 2 at a counter index 6. In other words, the address 2 at the counter index 6 becomes a base address and is determined as an inflection address.

In the second example, at the start address 12 allocated to the counter index 1, the counter index is increased by 1 and 1 is subtracted from the start address so that addresses are sequentially 11, 10, 9, 8, 7, 6, 5, 4, 3, 2, 1, and 0. At the final address 8 allocated to the counter index 16, the counter index is increased by 1 and 1 is subtracted from the final address so that addresses are sequentially 7, 6, 5, 4, 3, 2, 1, and 0. Then, 1 is respectively subtracted from the start address 12 and the final address 8 so that a difference between a start address 3 and the final address 2 is 1 at a counter index 10. In this case, the final address 2 becomes the inflection address.

FIG. 7 illustrates a power level waveform to which the concept of FIG. 6 is applied. Referring to FIG. 7, predetermined power levels are stored at 16 addresses of the ramp memory 422. For example, power levels of a third slot Slot#3, a fourth slot Slot#4, and a fifth slot Slot#5 of eight slots forming a TDMA frame will now be described. Assuming that a power level of the third slot Slot#3 is 7, a power level of the fourth slot Slot#4 is 12 and a power level of the fifth slot Slot#5 is 8, a guard period of each of the slots Slot#3, Slot#4, and Slot#5 is composed of 16 points. The 16 points correspond to the counter index previously described. At a guard period of the third slot Slot#3, 1 is subtracted from an address 7 in which the power level of the third slot Slot#3 is stored so that addresses are sequentially 6, 5, 4, 3, and 2, and 1 is added to the addresses of 2, 3, 4, 5, 6, 7, 8, 9, 10, and 11 so that addresses are sequentially 3, 4, 5, 6, 7, 8, 9, 10, 11, and 12. In this case, a U-shaped power waveform in which the address 2 becomes the inflection address is formed according to a power level stored in each address.

At a guard period of the fourth slot Slot#4, 1 is subtracted from the address 12 in which the power level of the fourth slot Slot#4 is stored so that addresses are sequentially 11, 10, 9, 8, 7, 6, 5, 4, 3, and 2, and 1 is added to the addresses of 2, 3, 4, 5, 6, and 7 so that addresses are sequentially 3, 4, 5, 6, 7, and 8. The final address 8 is an address in which the power level of the fifth slot Slot#5 is stored. In this case, a U-shaped power waveform in which the address 2 becomes the inflection address is formed according to a power level stored in each address.

According to the present invention, a guard period for classifying each of the slots Slot#3, Slot#4, and Slot#5 is power ramped-down and is then power ramped-up, thereby making a large power difference to have a U-shaped power waveform. As such, interference in the slots Slot#3, Slot#4, and Slot#5 is reduced, and information from the slots (e.g., Slot#3, Slot#4, and Slot#5) is easily read.

FIG. 8 is a flowchart illustrating the power ramping method according to an exemplary embodiment of the present invention. Referring to FIG. 8, when a start address at which a power level of a first slot is stored and a final address at which a power level of a second slot are provided, the start address is subtracted from the final address (step 810). If an index of a counter is greater than 16 (step 812), the power ramping method returns to step 810 of resetting the counter index. If a difference obtained by subtracting the start address from the final address is 0 or 1 (step 814), a counter index and an address are allocated to an inflection index and an inflection address (step 816).

Thereafter, if a ramping active signal that represents the start of a corresponding slot is activated at a logic high level (step 818), the counter index is increased by 1 (step 820). If the counter index increased by 1 is less than the inflection index (step 822), a ramping address is obtained by subtracting an address 1 from the start address (step 824). If the counter index increased by 1 is greater than the inflection index (step 822) and the ramping address is not the final address (step 826), the ramping address is increased by 1 at the inflection address until the ramping address is the same as the final address (step 828). Thereafter, a ramping waveform characteristic of a guard period is formed according to data stored in ramping addresses.

According to the present invention, power at a guard period for classifying slots is ramped down and then ramped up, thereby making a large power difference so that the slots have U-shaped power waveforms. As such, interference between slots is reduced, and slot information is easily read.

Although exemplary embodiments of the present invention are described above in detail, they are intended for illustrative purposes only and are not meant to limit the present invention. For example, in an exemplary embodiment of the present invention, a guard period has been divided into 16 points. It is to be understood by those skilled in the art, however, that the guard period may be divided into any number of points. It will also be understood by those skilled in the art that various changes in form and details may be made herein without departing from the spirit and scope of the invention as defined by the appended claims. Accordingly, it is intended that the scope of the invention be defined by the claims appended hereto and their equivalents.

What is claimed is:

1. A power ramping controller of a transmitter comprising frames for transmitting, each frame comprising a plurality of slots, each slot comprising a data period and a guard period for classifying continuous slots of the plurality of slots, the power ramping controller comprising:
   a ramp memory for dividing power levels of the plurality of slots within a power level range and storing the divided power level range from a lowermost address to an uppermost address;
   a counter for allocating a start address of the ramp memory for designating a power level of a first slot of the plurality of slots to a lower index and a final address of the ramp memory for designating a power level of a second slot of the plurality of slots to an upper index; and
   a controller for,
      dividing the guard period into a number of indices of the counter,
      increasing the lower index of the counter by 1 and subtracting 1 from the start address,
      decreasing the upper index of the counter by 1 and subtracting 1 from the final address,
      designating an address, at a time when a difference obtained by subtracting the start address from the final address is 0 or 1, as an inflection address, and
      determining ramp steps as power levels stored in addresses corresponding to the number of indices of the counter at the guard period.

2. The power ramping controller of claim 1, wherein the power ramping controller is connected to a power amplifier for outputting the power levels of the plurality of slots in response to the ramp steps.

3. The power ramping controller of claim 2, wherein the power amplifier has a U-shaped power ramping waveform in the guard period, wherein a power level of the start address lowers to a power level of the inflection address and then rises to a power level of the final address.

4. The power ramping controller of claim 1, wherein the transmitter is a radio-frequency (RF) transmitter.

5. The power ramping controller of claim 1, wherein the power levels of the plurality of slots are divided equally within the power level range.

6. A power ramping controller of a transmitter comprising frames for transmitting, each frame comprising a plurality of slots, each slot comprising a data period and a guard period for classifying continuous slots of the plurality of slots, the power ramping controller comprising:
   a ramp memory for dividing power levels of the plurality of slots within a power level range and storing the divided power level range from a lowermost address to an uppermost address;
   a first register for storing a start address of the ramp memory for designating a power level of a first slot of the plurality of slots;
   a second register for storing a final address of the ramp memory for designating a power level of a second slot of the plurality of slots;
   a counter for
      allocating the start address to a lower index,
      allocating the final address to an upper index,
      increasing the lower index by 1 and subtracting 1 from the start address, and
      decreasing the upper index by 1 and subtracting 1 from the final address;
   a comparator for comparing an address obtained by subtracting 1 from the start address with an address obtained by subtracting 1 from the final address;
   a third register for storing a counter index and an address at a time when a difference obtained by subtracting the start address from the final address is 0 or 1; and
   a ramp controller for designating the address stored in the third register as an inflection address and determining ramp steps as power levels stored in addresses which correspond to a final address of the upper index from a start address of the lower index via the inflection address at the guard period.

7. The power ramping controller of claim 6, wherein the power ramping controller is connected to a ramp digital-to-analog converter (DAC) for outputting the power levels of the slots in response to the ramp steps.

8. The power ramping controller of claim 7, wherein the ramp DAC has a U-shaped power ramping waveform in the guard period, wherein a power level of the start address lowers to a power level of the inflection address and then heightens to a power level of the final address.

9. The power ramping controller of claim 6, wherein the transmitter is a radio-frequency (RF) transmitter.

10. The power ramping controller of claim 6, wherein the power levels of the plurality of slots are divided equally within the power level range.

11. The power ramping controller of claim 6, further comprising:
   a buffer for receiving data stored in addresses which correspond to a final address of the upper index from a start address of the lower index via the inflection address in response to a ramping active signal that represents a start time of the plurality of slots;
   a linear interpolation unit for interpolating a ramp level according to an output of the buffer; and
   a multiplexer (MUX) for selectively outputting ramp step signals according to one of the output of the buffer and an output of the linear interpolation unit in response to a control signal.

12. A method for ramping power in a transmitter comprising frames for transmitting, each frame comprising a plurality of slots, each slot comprising a data period and a guard period for classifying continuous slots of the plurality of slots, the method comprising:
   dividing power levels of the plurality of slots within a power level range and storing the divided power level range from a lowermost address to an uppermost address;
   receiving a start address of a ramp memory for designating a power level of a first slot of the plurality of slots and a final address of the ramp memory for designating a power level of a second slot of the plurality of slots;
   allocating the start address to a lower index of a counter and increasing the lower index by 1 and subtracting 1 from the start address;
   allocating the final address to an upper index of the counter and decreasing the upper index by 1 and subtracting 1 from the final address;
   designating an address, at a time when a difference obtained by subtracting the start address from the final address is 0 or 1, as an inflection address, and determining ramp steps as power levels stored in addresses corresponding to the indices of the counter at the guard period; and
   outputting power levels of the plurality of slots in response to the ramp steps.

13. The method of claim 12, wherein the power levels of the plurality of slots within the power level range are divided equally.

14. A method for ramping power in a transmitter comprising frames for transmitting, each frame comprising a plurality of slots, each slot comprising a data period and a guard period for classifying continuous slots of the plurality of slots, the method comprising:
   dividing power levels of the plurality of slots within a power level range and storing data that represents the divided power level range from a lowermost address to an uppermost address;
   receiving a start address of a ramp memory for designating a power level of a first slot of the plurality of slots;
   receiving a final address of the ramp memory for designating a power level of a second slot of the plurality of slots;
   allocating the start address to a lower index of a counter and increasing the lower index by 1 and subtracting 1 from the start address;
   allocating the final address to an upper index of the counter and decreasing the upper index by 1 and subtracting 1 from the final address;
   comparing an address obtained by subtracting 1 from the start address with an address obtained by subtracting 1 from the final address;
   storing a counter index and an inflection address at a time when a difference obtained by subtracting the start address from the final address is 0 or 1;
   receiving the data stored in addresses which correspond to a final address of the upper index from a start address of the lower index via the inflection address in response to a ramping active signal that represents a start time of the plurality of slots; and dividing the guard period into a number of indices of the counter and allocating a ramp waveform characteristic of the guard period according to the data stored in the addresses corresponding to the number of indices of the counter.

15. The method of claim 14, further comprising:
linearly interpolating the data stored in the addresses corresponding to the number of indices of the counter and generating a power waveform of the guard period.

16. The method of claim 14, wherein the power levels of the plurality of slots within the power level range are divided equally.

17. A method for ramping power ramping in a transmitter comprising frames for transmitting, each frame comprising a plurality of slots, each slot comprising a data period and a guard period for classifying continuous slots of the plurality of slots, the method comprising:
initializing a counter;
dividing power levels of the of the plurality of slots within a power level range and storing data that represents the divided power level range from a lowermost address to an uppermost address;
receiving a start address of a ramp memory for designating a power level of a first slot of the plurality of slots;
receiving a final address of the ramp memory for designating a power level of a second slot of the plurality of slots;
storing an inflection index and an inflection address at a time when a difference obtained by subtracting the start address from the final address is 0 or 1;
increasing an index of the counter by 1 in response to a ramping active signal that represents a start time of the plurality of slots;
subtracting 1 from the start address until the index of the counter becomes the inflection index and allocating the start address to a ramping address;
wherein if the index of the counter is greater than the inflection index and the ramping address is not the final address, adding 1 to the inflection index; and
allocating a ramp waveform characteristic of the guard period according to the data stored in ramping addresses.

18. The method of claim 17, wherein the power levels of the plurality of slots within the power level range are divided equally.

* * * * *